(12) United States Patent
Echizen et al.

(10) Patent No.: US 6,860,974 B2
(45) Date of Patent: Mar. 1, 2005

(54) LONG-TERM SPUTTERING METHOD

(75) Inventors: Hiroshi Echizen, Nara (JP); Yasuyoshi Takai, Nara (JP); Akiya Nakayama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/183,339

(22) Filed: Jun. 28, 2002

(65) Prior Publication Data

US 2003/0085116 A1 May 8, 2003

(30) Foreign Application Priority Data

Jun. 29, 2001 (JP) ........................................ 2001-198952

(51) Int. Cl.$^7$ ............................................. C23C 14/32
(52) U.S. Cl. .......................... 204/192.26; 204/192.22; 204/192.27; 204/192.28; 204/192.29; 204/192.15
(58) Field of Search ....................... 204/192.26, 192.27, 204/192.28, 192.29, 192.22, 192.15

(56) References Cited

U.S. PATENT DOCUMENTS

| | | | |
|---|---|---|---|
| 4,419,533 A | 12/1983 | Czubatyj | 136/259 |
| 5,620,530 A | 4/1997 | Nakayama | 136/259 |
| 5,998,730 A | 12/1999 | Shiozaki et al. | 136/256 |
| 6,140,570 A | * 10/2000 | Kariya | 204/192.29 |
| 6,554,973 B2 | 4/2003 | Nakayama | 204/192.27 |
| 2002/0134670 A1 | 9/2002 | Echizen et al. | 204/192.13 |

FOREIGN PATENT DOCUMENTS

| | | |
|---|---|---|
| JP | 61-64874 | 4/1986 |
| JP | 2-1633363 | 6/1990 |
| JP | 6-116722 | 4/1994 |
| JP | 10-310862 | 11/1998 |
| JP | 3007758 | 11/1999 |

* cited by examiner

Primary Examiner—Rodney G. McDonald
(74) Attorney, Agent, or Firm—Fitzpatrick, Cella, Harper & Scinto

(57) ABSTRACT

There are provided techniques of forming a back reflecting layer with constant characteristics throughout long-term film formation and forming a metal oxide film so as to be able to maintain a current of a bottom cell and thereby keep a short-circuit current Jsc of a solar cell constant over a long period of time. A sputtering method is a method of forming a stack of a metal film and a metal oxide film, comprising the step 1 of forming a metal layer on a substrate, the step 2 of bringing a surface of the metal layer into contact with active oxygen, and the step 3 of forming a metal oxide film thereon after the step 2, wherein in the step 2 an amount of active oxygen at a first substrate position is different from that at a second substrate position.

17 Claims, 5 Drawing Sheets

LONG-TERM SPUTTERING METHOD

BACKGROUND OF THE INVENTION

1. Field of the Invention

The present invention relates to a method of stably performing a non-reactive sputtering method of forming a metal oxide film from a metal oxide target, over a long period of time. Particularly, the invention relates to a sputtering method of forming a metal oxide film on a metal film while controlling oxidation of the underlying metal film over a long period of time. More particularly, the invention relates to a sputtering method of varying amounts of active oxygen depending upon substrate positions (in other words, portions).

2. Related Background Art

Conventionally, there are well-known magnetron sputtering methods of forming the metal oxide film from the metal oxide target. Among them, proposals have been made to improve mechanical, electrical, or optical characteristics of the deposited film by controlling the amount of water vapor ($H_2O$) present in an atmosphere during sputtering.

For example, Japanese Patent Application Laid-Open No. 61-64874 suggests, as a method of forming a metal oxide film, a technique of adding water vapor $H_2O$ to Ar gas, thereby preventing a stepped cut of a wiring pattern laid on the metal oxide film of an interlayer dielectric.

Japanese Patent Application Laid-Open No. 02-163363 suggests addition of water vapor $H_2O$, or $O_2+H_2O$ to Ar gas as a method of forming an ITO film. The Application describes that the addition of $H_2O$, or $O_2+H_2O$ is effective in improvement in electrical conductivity of ITO formed at substrate temperatures of room temperature to 200° C.

Further, Japanese Patent Publication No. 3007758 suggests, as a method of forming an ITO (Indium Tin Oxide) film, addition of one of $N_2$, $SiH_4$, $NH_3$, and $PH_3$ to Ar gas, in order to overcome the problem of unstable transparency and film thickness of the ITO film due to adsorption of $O_2$ to the target in the previous $O_2$ addition methods. It is described that the method was successful in achieving stable transparency and film thickness.

Meanwhile, it is disclosed that when $H_2O$ or $H_2$ is added in order to stabilize etching rates of the ITO film formed over a long period of time, the etching rates can be maintained constant, independent of film forming durations (0–3 hours). (Plastics Processing Technologies (Plastics Kako Gijutsu), p12–p18 and FIG. 5, Vol. 17, No. 3 (1990))

Concerning formation of a back reflecting layer of a solar cell, U.S. Pat. No. 4,419,533 discloses a technique of forming a barrier layer of zinc oxide or the like so as to prevent the reflecting layer from diffusing into a photoelectric conversion layer. Specifically, a transparent conductive layer of a metal oxide or the like is interposed between the reflecting layer and the semiconductor layer, thereby preventing the diffusion of zinc oxide.

Japanese Patent Application Laid-Open No. 10-310862 (correspondent of U.S. Pat. No. 5,998,730), which was also filed by the Assignee of the present application, describes a technique of heating and cooling a film forming chamber, thereafter forming a metal reflecting film on a substrate, bringing the film into contact with active oxygen, and then forming a transparent conductive film thereon, by which the reflecting film and the transparent conductive film can be stably formed in desired texture structure, with high reflectance, at low cost, and with high reliability. Namely, the interface is positively oxidized between the metal layer and the metal oxide layer, thereby preventing "oxidation of the metal layer by the metal oxide layer" and "melanization due to reduction of the metal oxide layer." The control on the amount of active oxygen is employed for oxidation of a metal target by the reactive sputtering method, but is normally not employed for the production from the metal oxide target by the non-reactive sputtering method.

The foregoing conventional example (Plastics Processing Technologies) discloses the technique of maintaining the characteristics of the ITO film constant throughout the film forming duration of three hours, but fails to disclose any technique of forming a stable metal oxide film for maintaining characteristics of the semiconductor element such as the solar cell or the like constant throughout long-term film formation.

It is generally known that the addition of water vapor in the above conventional example involves the following problems. Namely, the problems are:
1. need for a water vapor generator by bubbling,
2. need for temperature management so as to avoid dew condensation in a pipe from the water vapor generator to the film forming chamber,
3. need for a device for monitoring the condition of water vapor inside the film forming chamber,
4. need for means for avoiding influence of water vapor adhering to the monitoring device itself, and so on.

There is also a method of monitoring the interior of the discharge space with a quadrupole mass spectrometer or the like and controlling the amount of water vapor introduced into the vacuum chamber, but it lacks precision. A conceivable reason for it is that it is affected by adsorption and dew condensation of water on the water adding means and the monitoring device.

Further, even in film formation under constant discharge current, voltage, and power in a back reflecting layer producing system (hereinafter also referred to as BR apparatus) detailed hereinafter, long-term sputtering film formation of metal/metal oxide films on a beltlike substrate (note: a beltlike substrate wound in a roll form will also be referred to as a roll substrate) can result in forming a back reflecting layer (hereinafter also referred to as a BR layer) with different surface textures at an initial position and at a last position of the beltlike substrate, and formation of a solar cell thereon does not readily allow the solar cell to be formed with Jsc (short-circuit current) constant.

It is mentioned in general that the optical confinement function of the surface texture lengthens optical path lengths of incident light to facilitate absorption of the light in the photovoltaic layer of the solar cell. Accordingly, the surface texture departing from the desired shape must result in reduction of Jsc.

SUMMARY OF THE INVENTION

An object of the present invention is to provide a sputtering method capable of forming a metal oxide film to enable achievement of constant characteristics of a semiconductor element even in the case of film formation over a long period of time (not less than three hours). Particularly, an object of the invention is to provide a sputtering method capable of forming a BR layer to enable achievement of constant conversion efficiency on the basis of constant Jsc of a solar cell.

The sputtering methods are simple methods capable of maintaining high productivity.

The present invention is based on the invention described in Japanese Patent Application Laid-Open No. 10-310862

(U.S. Pat. No. 5,998,730), filed by the Assignee of the present application, and is an expansion thereof.

The cause of the above problem was assumed to be decrease in the amount of water adsorbing to the interior of the BR apparatus. Namely, it was contemplated that when the BR apparatus was activated, the BR apparatus itself was heated by a heater and by plasma to increase its temperature, so as to move into an environment where the adsorbing water was prone to desorb and that there was no supply of water from outside into the chamber, so as to establish a background where continuous operation of the BR apparatus resulted in monotonically decreasing the amount of adsorbing water. Then, the inventors have conducted elaborate research to achieve the above objects, and finally completed the present invention.

Namely, an object of the present invention is to provide a method of forming the BR layer with constant characteristics, thereby enabling provision of semiconductor elements with little variation in quality, e.g., semiconductor elements such as solar cells and the like with little variation in such characteristics as the shunt current Jsc of the bottom cell, the conversion efficiency, and so on. Namely, an essential feature of the present invention is that "the amount of active oxygen is varied in a film forming chamber for forming an interface between a metal film and a metal oxide film" according to an operating time of the BR apparatus to form a sputtering film (specifically, a BR layer for a solar cell) with constant characteristics, thereby effectively suppressing decrease of Jsc of the solar cell formed thereon.

An essential feature of the method of varying the amount of active oxygen is that the amount of active oxygen is not varied with respect to the direction of the film thickness of the sputtering film, but is varied according to the operating time of the BR apparatus; i.e., on the presumption of movement of the substrate, the amount of active oxygen is varied among different substrate positions, as described hereinafter.

A method according to the present invention is [1] a sputtering method of forming a stack of a metal film and a metal oxide film, comprising the step 1 of forming a metal layer on a substrate, the step 2 of bringing a surface of the metal layer into contact with active oxygen, and the step 3 of forming a metal oxide film thereon after the step 2, wherein in the step 2 an amount of active oxygen at a first substrate position is different from that at a second substrate position.

A preferable embodiment of the present invention is [2] the sputtering method according to above [1] wherein in the step 2 the amount of active oxygen is decreased on a continuous and/or stepwise basis.

Another preferable embodiment of the present invention is [3] the sputtering method according to above [1] or [2] wherein the substrate is a single substrate.

Another method according to the present invention is [4] a sputtering method of forming a stack of a metal film and a metal oxide film, comprising the step 1 of forming a metal layer on a substrate, the step 2 of bringing a surface of the metal layer into contact with active oxygen, and the step 3 of forming a metal oxide film thereon after the step 2, wherein the step 3 includes the step A involving contact with active oxygen and the step B devoid of contact with active oxygen and wherein in the step A an amount of active oxygen at a first substrate position is different from that at a second substrate position.

A preferable embodiment of the present invention is [5] the sputtering method according to above [4] wherein in the step A of the step 3 the amount of active oxygen is decreased on a continuous and/or stepwise basis.

Another preferable embodiment of the present invention is [6] the sputtering method according to above [4] or [5] wherein the substrate is a single substrate.

BRIEF DESCRIPTION OF THE DRAWINGS

FIGS. 1A and 1B are graphical representations for explaining typical setting examples of discharge current values of oxygen plasma according to the present invention, wherein FIG. 1A is a graph for explaining a typical setting example of discharge current values of oxygen plasma at cathode electrodes No. 3 and No. 4 in the step 3-A (See Example 1), and FIG. 1B a graph for explaining a typical setting example of discharge current values of oxygen plasma at a cathode electrode No. 2 in the step 2 (See Example 6);

FIGS. 3A, 3B and 3C are graphical representations showing transitions of relative values of conversion efficiency, Voc, and Jsc of solar cells produced using BR films made by the method of the present invention, wherein FIG. 3A is a graph showing transitions of relative values of conversion efficiency, FIG. 3B a graph showing transitions of relative values of Voc, and FIG. 3C a graph showing transitions of relative values of Jsc;

FIGS. 4A and 4B are schematic representations of a sputtering apparatus used in the present invention, wherein FIG. 4A is a top plan view of the sputtering apparatus and FIG. 4B a front view thereof; and FIGS. 5A, 5B and 5C are graphical representations showing transition examples of relative values of conversion efficiency, Voc, and Jsc of solar cells produced using BR films made while maintaining the discharge current values of oxygen plasma constant, wherein FIG. 5A is a graph showing a transition example of relative values of conversion efficiency, FIG. 5B a graph showing a transition example of relative values of Voc, and FIG. 5C a graph showing a transition example of relative values of Jsc.

DESCRIPTION OF THE PREFERRED EMBODIMENTS

First, a configuration of a BR layer forming apparatus will be described.

1. Description of Sputtering Apparatus

The following will describe an example of production of an amorphous silicon (hereinafter referred to as "a-Si") base (which is a concept also including SiGe and others) solar cell of layer structure described below with reference to FIG. 2, using a Roll to Roll type magnetron sputtering apparatus (which is a kind of the BR apparatus) shown in FIGS. 4A and 4B, but it is noted that the apparatus is by no means intended to be limited to the Roll to Roll type apparatus. Therefore, the present invention can also be applied to batch processing apparatus arranged to convey a lot of substrates, and to step conveyance type apparatus. Further, the devices do not have to be limited to the solar cells.

In the case where the present invention is applied to the foregoing batch type apparatus, the aforementioned first substrate position and second substrate position may be defined so that the first substrate position represents a lot fed at a start of the apparatus and the second substrate position an arbitrary lot fed after the start lot.

In the case where the present invention is applied to the Roll to Roll type magnetron sputtering apparatus, the first substrate position can be defined as a film forming portion of a beltlike substrate used in the Roll to Roll type magnetron sputtering apparatus and the second substrate position as an arbitrary portion of the substrate succeeding the film forming position (the first substrate position).

The following will describe an example of sputtering based on 18-hour continuous operation of the BR apparatus with the beltlike substrate to stack a metal film and a metal oxide film in order, but it is noted that the example is by no means intended to set limits to the shape of the substrate, the film forming time, materials, and the number of forming chambers.

In the BR apparatus herein two metal targets and a plurality of metal oxide targets are arranged in a line and are provided with their respective cathode electrodes to implement sputtering. The cathode electrodes consist of a cathode electrode 420 (Al), a cathode electrode 421 (Al), a cathode electrode 422 (ZnO), . . . , as denoted in the order of arrangement of the targets. Symbols in parentheses designate materials. In practice, the number of targets can be adequately determined in consideration of a desired BR film thickness, a desired substrate conveying speed, and a film forming speed.

Figure 4A:
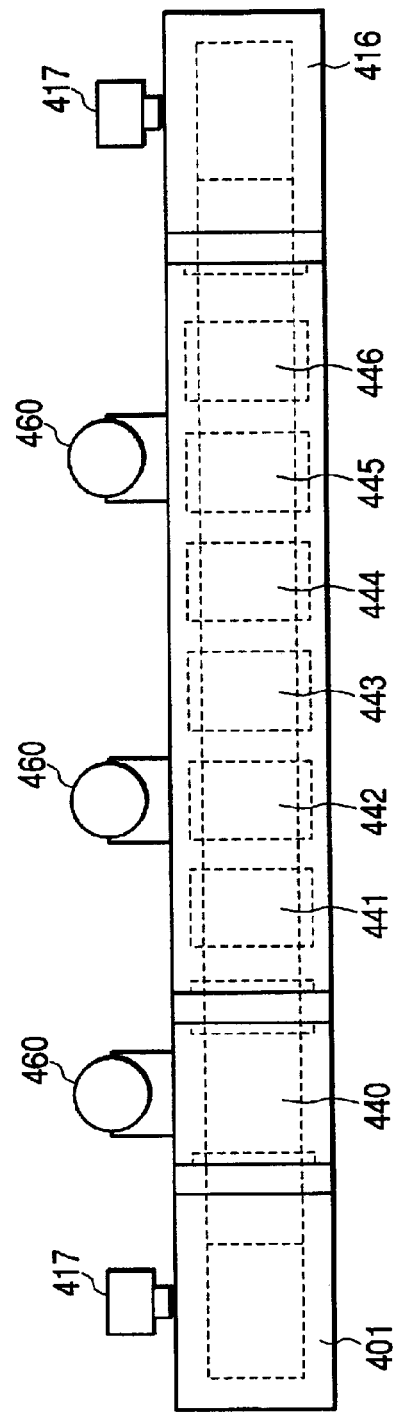
Figure 4B:
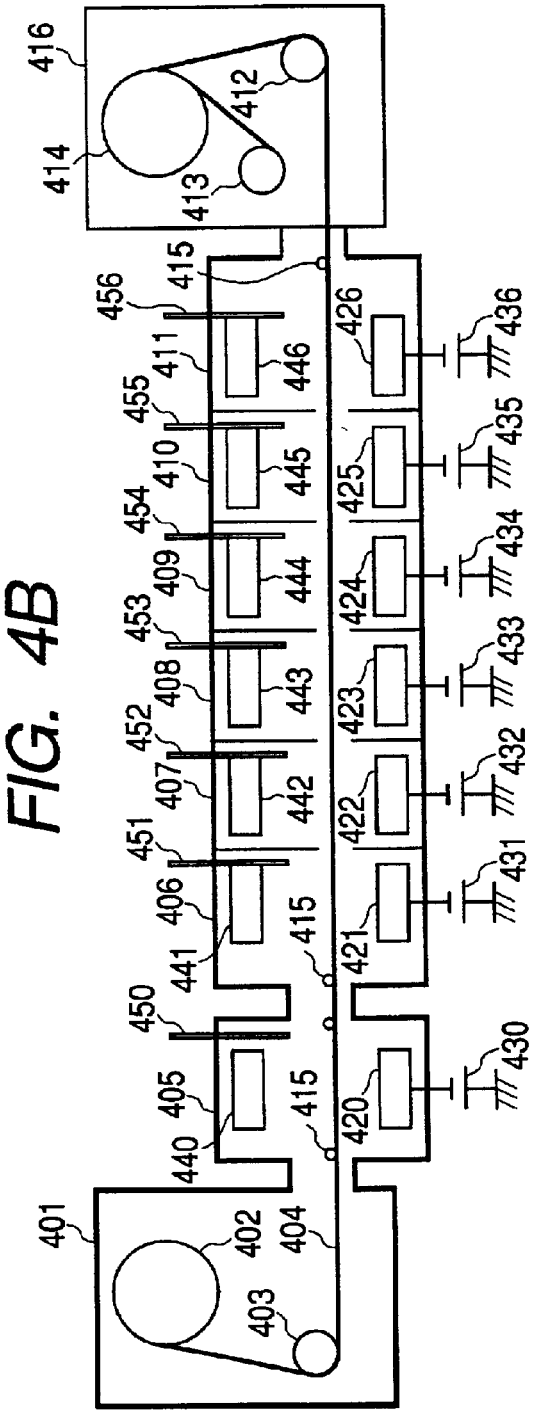

In FIGS. 4A and 4B, numerals 405 and 406 designate reflecting metal layer forming chambers and 407 to 411 transparent conductive metal oxide layer forming chambers.

In FIGS. 4A, 4B, the reflecting layer forming chamber 405 is arranged so that the electrode 420 and a power supply 430 for supplying a dc power to the electrode are placed below the substrate 404. A heater 440 is fixed to an upper lid of the reflecting layer forming chamber 405 above the substrate 404. Further, a gas feed pipe 450 is routed from the outside of the reflecting layer forming chamber 405 into an internal chamber not shown. The other chambers 406 to 411 are also constructed in similar structure.

Normally, Ar gas is fed through the gas feed pipes and a plasma is generated by the dc power to implement magnetron sputtering. However, only oxygen gas is fed to the cathode electrode 421 (Al) and to the cathode electrode 422, 423 (ZnO). Namely, only oxygen gas is supplied into the reflecting layer forming chamber 406 and into the transparent conductive layer forming chamber 407, 408.

In this BR apparatus, the step 1 is carried out in the reflecting layer forming chamber 405, the step 2 in the reflecting layer forming chamber 406, the step A of the step 3 (hereinafter referred to as step 3-A) in the transparent conductive layer forming chamber 407, 408 and the step B of the step 3 (hereinafter referred to as step 3-B) in the transparent conductive layer forming chambers 409 to 411.

2. General Steps of BR Apparatus

The back reflecting layer is formed through the following steps by the above BR apparatus.

(1) Setting of the roll substrate 402
(2) Evacuation of the film forming chambers
(3) Baking and cooling to film forming temperatures of the film forming chambers
(4) Supply of oxygen gas and Ar gas
(5) Regulation of pressure
(6) Conveyance of the substrate
(7) Start of magnetron sputtering
(8) Stop of the apparatus and exposure to the atmosphere
(9) replacement of the targets, substrate, deposition-preventing sheet, and so on The above works are carried out repeatedly.

3. Confirmation of Degradation of Characteristics Under Constant Discharge Conditions of the BR Apparatus With almost all the targets in the BR apparatus, the film formation was performed at a fixed discharge current, i.e., at the fixed number of ions. The BR layer was formed under the baking conditions of 600° C. and 30 minutes in the BR apparatus, and a triple-cell a-Si base solar cell (top cell/middle cell/bottom cell in order from the light incidence side: a forming method of which will be described in Examples) of the structure of FIG. 2 was produced on the BR layer. The solar cell was evaluated as to the conversion efficiency, open-circuit voltage Voc, and shunt current Jsc with a solar simulator available from Yamashita Denso K.K. (the degree of coincidence of the solar spectrum of the light source is defined by JIS), and the results are presented in FIGS. 5A, 5B, and 5C, as relative values based on the reference (100%) of the conversion efficiency, Voc, and Jsc of 10.55%, 2.08 V, and 7.45 mA/cm$^2$, respectively.

Figure 5A:
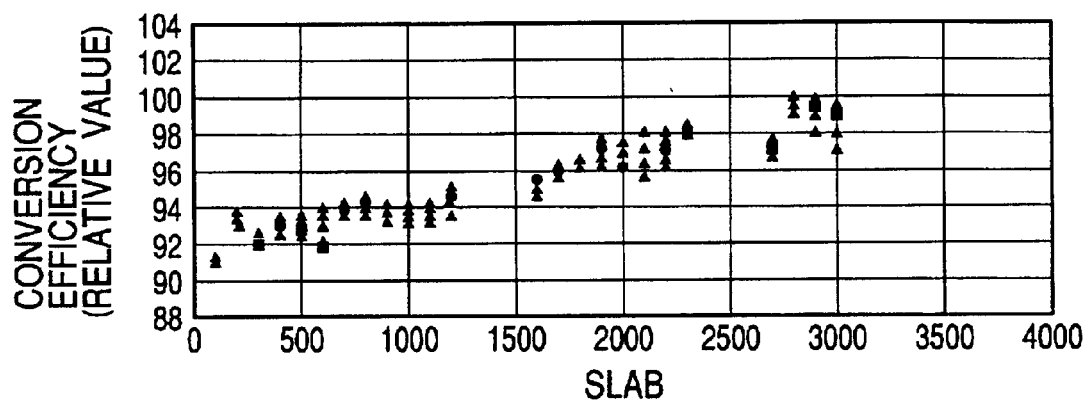
Figure 5B:
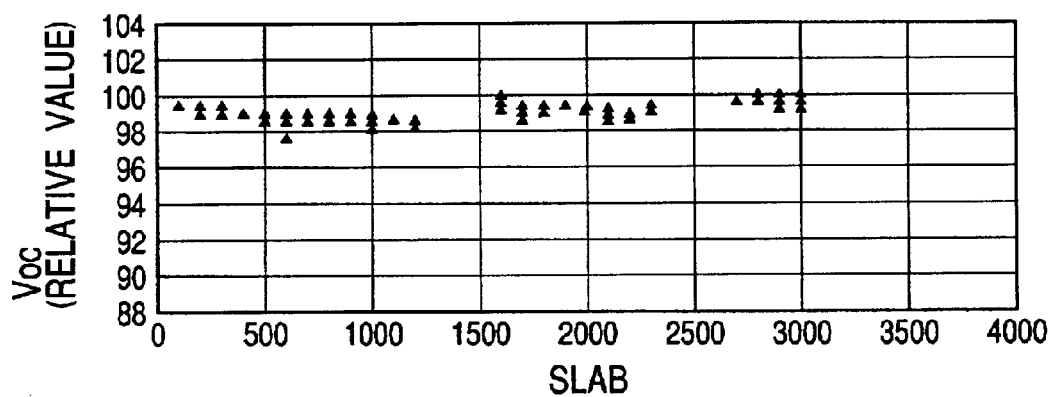
Figure 5C:
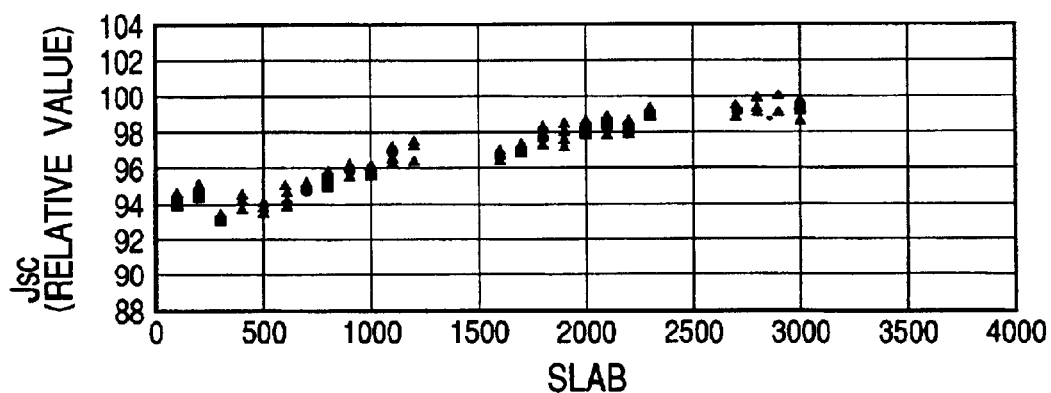

In FIG. 5A, the horizontal axis represents slab numbers (which are numbers of slabs obtained as described below by cutting the beltlike substrate at intervals of 0.25 m in the longitudinal direction from the origin at an end of effective part of the beltlike substrate and numbering the cut slabs in order of 1, 2, . . . , and which represent positions of the beltlike substrate), and the vertical axis relative values of conversion efficiency. In FIGS. 5B and 5C the horizontal axis represents the same slab numbers, and the vertical axis relative values of Voc and relative values of Jsc, respectively.

As seen from FIG. 5B, Voc is approximately constant from No. 0 to No. 3000.

In FIG. 5C, where Jsc near No. 3000 is defined as 100%, Jsc at No. 100 is approximately 5.4% lower. It is noted herein that a substrate position at a start of film formation of the BR apparatus corresponds to the vicinity of No. 3500 and a substrate position at an end of film formation to the vicinity of No. 100. In the BR apparatus the film formation is performed from right to left on the horizontal axis. Namely, a monotonically decreasing tendency of Jsc is recognized from the start position (near No. 3500) of film formation of the BR apparatus to the end position (near No. 100) of BR film formation. The quantum efficiency of the solar cell was measured in the wavelength range of 400 nm to 1000 nm by a spectral sensitivity measuring system available from Bunkokeiki K.K. Jsc of the bottom cell in the photovoltaic layer was calculated by convolution of the quantum efficiency and the solar spectrum and displayed on a display unit of the measuring system. According to the analysis by this measuring system, the bottom cell in the start position of film formation of the BR apparatus demonstrated high values of Jsc, but the bottom cell in the end position of film formation of the BR apparatus demonstrated lower values of Jsc. As a consequence, the conversion efficiency at the end position of film formation of the BR apparatus is considered to be lower than that at the start position of film formation of the BR apparatus, which is recognized in FIG. 5A. Namely, the analysis by the spectral sensitivity measuring system clarified that the conversion efficiency and Jsc varied in correspondence with each other and Jsc of the bottom cell was dominant over total Jsc among the triple cells.

4. Assumption of Mechanism for Preventing Decrease of Jsc

We assume that the following can be a mechanism of preventing a large change in Jsc of the solar cell, regardless of positions of a substrate, in the production of the solar cell on the BR layer produced by the sputtering method of the present invention.

The mechanism can be schematically described as follows:

1) the long-term film formation (the effects of heat, plasma, and evacuation) decreases the amount of water adsorbing to the surfaces of the targets, porous portions of the targets, and interiors of the forming chambers;
2) the long-term film formation also decreases the amount of radicals (active species) necessary for desorption of water adsorbing to the surfaces of the targets;
3) the discharge current value of the oxygen atmosphere (density of oxygen plasma) is lowered according to 2);
4) the reaction becomes constant between water and the metal layer immediately below the interface between the metal film and the metal oxide film;
5) the film quality (texture) of the BR film becomes uniform over a long period of time;
6) Jsc of the bottom cell of the solar cell formed on the BR layer becomes constant during the long-term film formation;
7) the conversion efficiency of the solar cell becomes constant during the long-term film formation.

The present invention has clarified the conditions for preventing the decrease of Jsc even in the case of forming the BR layer over the long term and forming the triple-cell a-Si base solar cell thereon. Specifically, the inventors found the condition that the metal film should be brought into contact with active oxygen by sputtering with flow of oxygen or mixed gas of oxygen and Ar in the film forming chamber corresponding to the interface between the metal layer and the metal oxide layer (the film forming chambers 406, 407, 408 in FIGS. 4A and 4B, i.e., the target surfaces corresponding to the cathode electrodes 421, 422, 423) and the condition that "the amount of active oxygen in the initial stage of film formation in the film forming chamber corresponding to the interface should be varied by the time of the end of film formation." The initial stage of film formation and the time of the end of film formation herein refer to an initial position and a last position of a long substrate like the beltlike substrate, and it is noted that the amount of active oxygen is not varied with respect to the direction of film thickness of the sputtering film, as described previously.

The invention described in Japanese Patent Application Laid-Open No. 10-310862 filed by the Assignee of the present application, which is the basis of the present invention, is based on the following two points:

1) in the step 2 the metal layer is positively oxidized to form a stable oxidized metal film;
2) in the step 3-A, where the metal oxide film is formed from the metal oxide target, the concentration of oxygen in the metal oxide film is controlled by positively controlling the amount of active oxygen.

In contrast to it, the present invention is based on the following points: "introduced oxygen is indirectly excited by Ar plasma from the adjacent electrode (Example 1) or directly excited at the electrode to be oxygen plasma (Example 6) and the excited oxygen adsorbs to the metal layer" and "the amount of active oxygen at the end of film formation is varied from that immediately after the start of film formation in the film forming chambers 407, 408 (step 3-A) corresponding to the interface between the metal film and the metal oxide film." In other words, "in the case of the sputtering apparatus having the conveying mechanism of the beltlike substrate or the like, the amount of active oxygen at the initial position of the beltlike substrate (which is referred to as a first substrate position) is changed to that at a position thereafter (which is referred to as a second substrate position)."

"In the case of the sputtering apparatus having the batch type conveying mechanism, the amount of active oxygen for the nth substrate is changed to that for the (n+k)th substrate thereafter." Here n and k are natural numbers not less than 1.

This change includes both increase and decrease, but explanation and understanding is theoretically easier in the case of "decrease." Therefore, the following will describe the "decrease." Since various ways of the change are possible depending upon adsorption of water in each apparatus, it is preferable to verify the change by experiment.

5. Decrease of Active Oxygen Amount (Step 3-A & Step 2)

In the method of the present invention including "the step of substantially decreasing the amount of active oxygen at the interface part," the amount of active oxygen may be decreased on a continuous basis or on a stepwise basis. It is a matter of course that a combination of continuous/stepwise setting changes can be employed. Here the amount of active oxygen may be determined by either one of the following methods:

(1) the electron density (plasma density) is determined by the Langmuir probe method to define the amount by a central value;
(2) a plasma emission monitor system is used to define the amount by optical intensity;
(3) it is determined by employing the discharge current value of oxygen plasma by the power supply.

The following will describe a setting method (3) above of decreasing the amount of active oxygen at the interface part in the method of the present invention.

Figure 2:
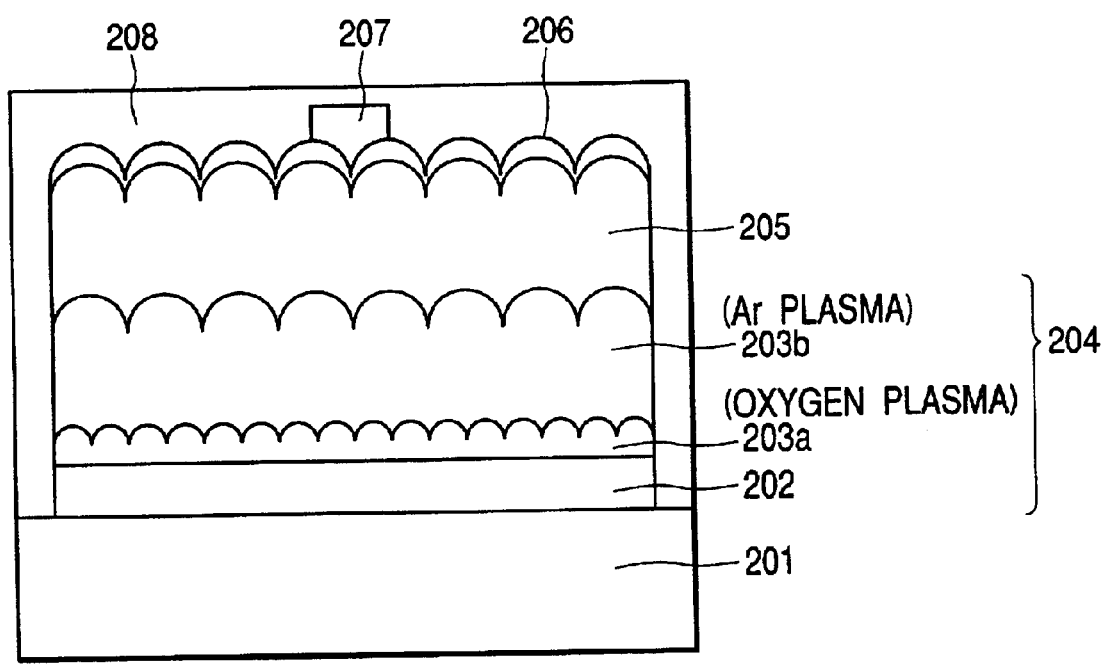
FIG. 2 is a schematic view illustrating a layer configuration of a solar cell for verifying the effect of the present invention.

The determining process of the setting method includes the steps of first determining an adequate setting curve of discharge current value (which can be a straight line), forming the BR layer according to the curve, forming the triple-cell a-Si base solar cell in the structure of FIG. 2 thereon, evaluating the solar cell by the solar simulator, and modifying the setting curve from the result of the evaluation by the trial-and-error method.

The following will present examples of such setting curves obtained as described above.

In the BR apparatus the film forming time of 18 hours is divided into four, which will be denoted by 1st Q, 2nd Q, 3rd Q, and 4th Q (Q=quarter) based on the start of film formation. When the discharge current value at 1st Q is defined as a reference (×1), in the step 3-A discharge current values of the two cathode electrodes 422, 423 in the respective quarters are, for example, shown in FIG. 1A. In the step 2 discharge current value of it (cathode electrode 421) is shown in FIG. 1B.

The graphs of FIGS. 1A and 1B will be described below for each of the quarters.

The discharge current value is ×1 at the start and end of 1st Q and is a little higher than ×1 in the intermediate part of 1st Q. In 2nd Q the discharge current value is linearly decreased so as to pass ×1 at the start and ×0.43 at the end. In 3rd Q, the discharge current value is set so as to pass three points of ×0.43 at the start, ×0.3 at the end, and ×0.25 on the way. In 4th Q, the discharge current value is set so as to pass ×0.3 at the both start and end, and it is set a little larger than ×0.3 in the intermediate part.

These numeral values are not intended to provide limits to the sputtering method, the film characteristics, and so on.

6. Change of Discharge Voltage (Discharge Power) and Countermeasures

We noted change of power of oxygen plasma in each quarter with the discharge current value being maintained constant, and clarified that gradual increase in the discharge voltage in each quarter resulted in gradual increase in the discharge power. This phenomenon is construed as a result of the following: melanized substances, so called nodules, are deposited on the target surfaces to constitute a resistive component, so as to gradually increase the discharge voltage. After continuation of this phenomenon for approximately three days, abnormal discharge (arc discharge) becomes easier to occur, and stable discharge is not achieved at last even with insertion of a circuit for cutting the arc discharge.

In order to avoid this situation, it is desirable to polish the surfaces of the targets of the cathode electrode 421, 422, 423 after completion of every film formation. The polishing may be implemented by use of a scraper or sand paper. The other targets do not have to be treated in this way in particular.

As described above, "the number of ions of active oxygen at the interface part is substantially decreased" whereby there is little decrease in Jsc even after the sputtering film formation over the long term.

Figure 1A:
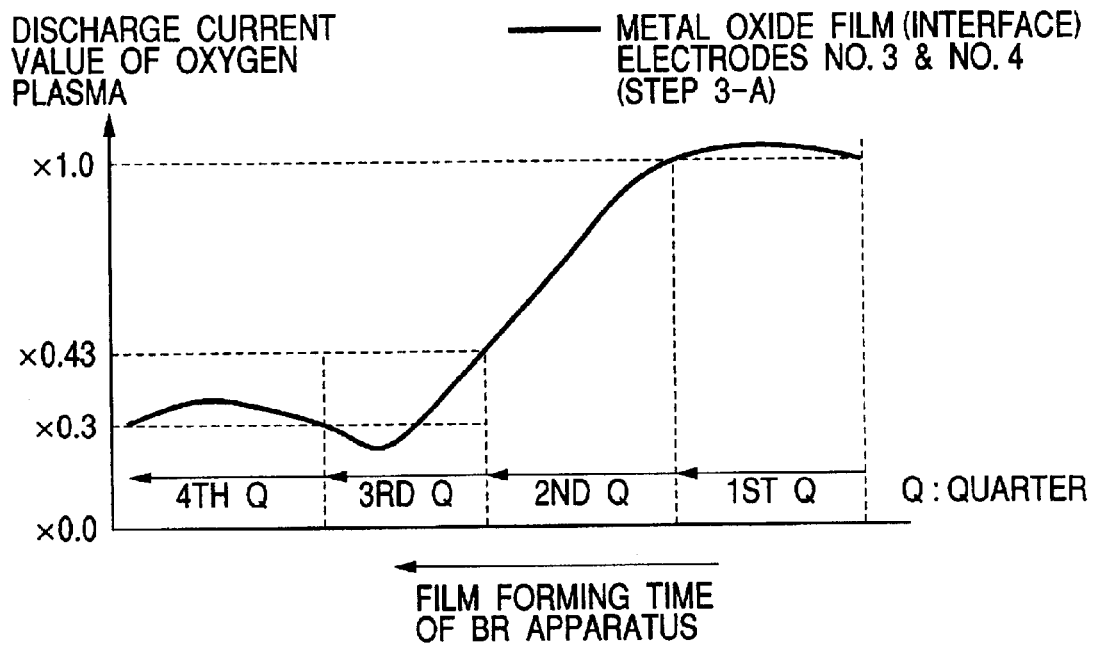
Figure 1B:
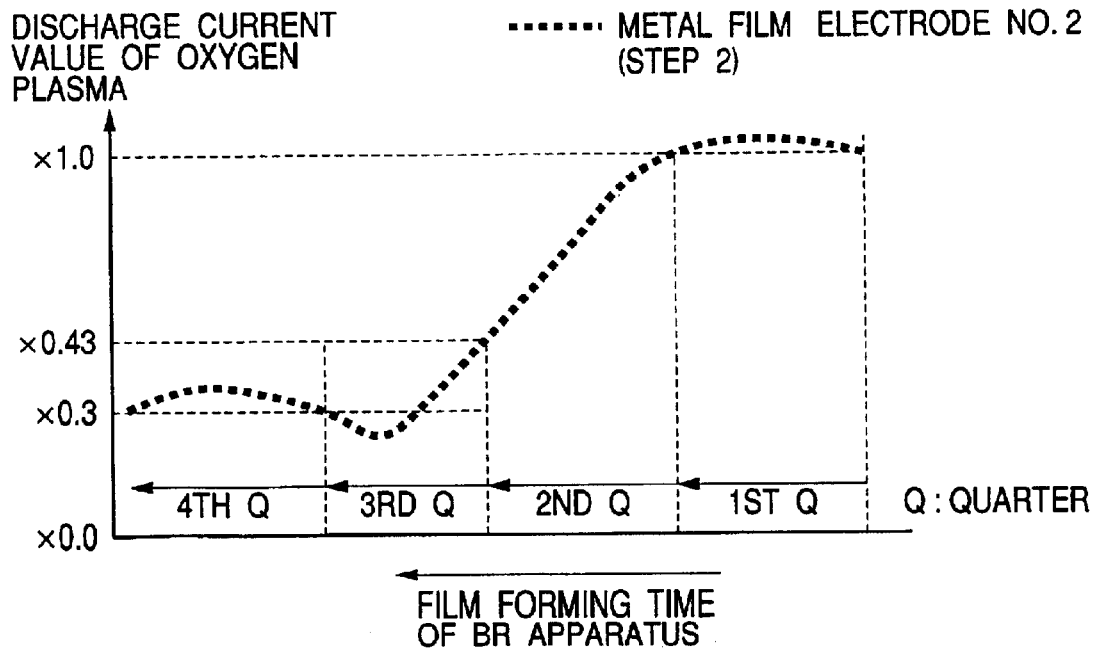

FIGS. 1A and 1B are the graphical representations showing typical setting examples of the discharge current values of oxygen plasma in the method of the present invention. FIG. 1A shows a typical setting example of discharge current values of oxygen plasma at the cathode electrodes No. 3 & No.4 in the step 3-A, and FIG. 1B a typical setting example of discharge current values of oxygen plasma at the cathode electrode No.2 in the step 2.

Figure 3A:
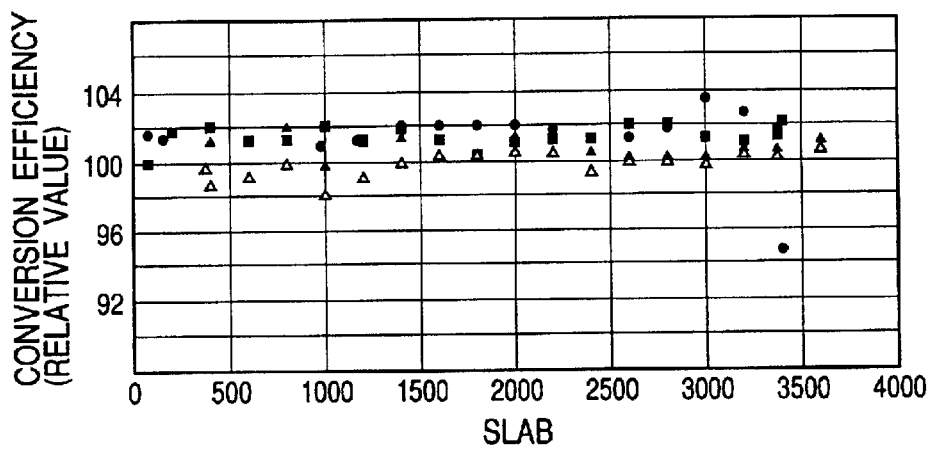
Figure 3B:
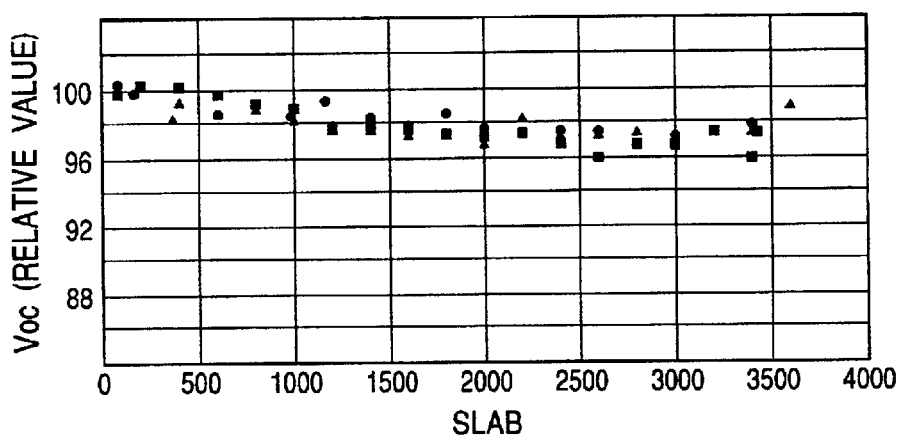
Figure 3C:
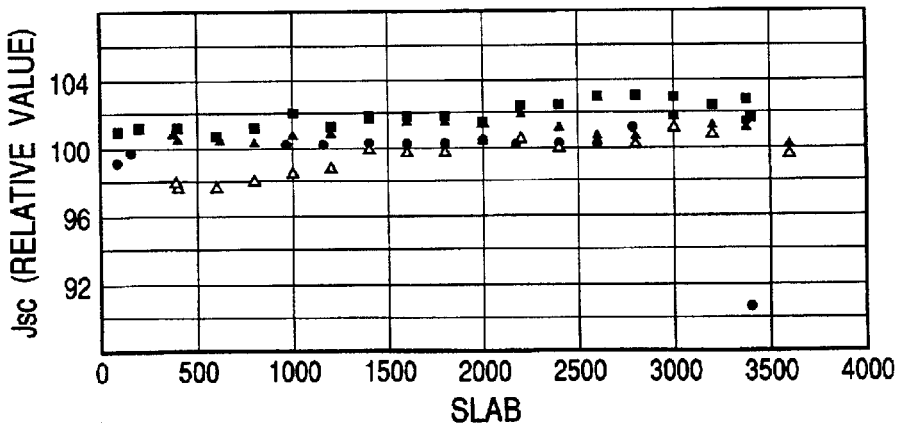

FIGS. 4A and 4B are the schematic representations showing the BR apparatus. Using this apparatus, the BR layer was produced, and predetermined layers were made on this BR layer, whereby the solar cell was produced in the layer structure shown in FIG. 2. FIGS. 3A to 3C present the results of evaluation of the solar cell.

The solar cell of FIG. 2 is comprised of the a-Si base triple cells, and is constructed in the structure in which a back reflecting layer 204 (BR layer) comprised of a metal film 202 and a metal oxide film 203a, 203b, a photovoltaic layer 205, a transparent electrode layer 206, a collecting electrode 207, and a hard coat 208 are stacked in order on a substrate 201.

The back reflecting layer 204 is comprised of the metal layer 202 of Ag or Al, and the metal oxide film 203a, 203b as a diffusion barrier layer of ZnO or the like, and is formed on a beltlike substrate by the foregoing BR apparatus of FIGS. 4A, 4B. Then, the substrate is wound up into a roll.

The photovoltaic layer 205 is a stack of triple cells of three nip configurations (not shown), which have peak wavelengths of photosensitivity near 800 nm, 600 nm, and 450 nm in order from the bottom (the bottom cell, the middle cell, and the top cell). The solar cell is designed so that the top cell among the triple cells has the smallest Jsc. These cells are formed on the beltlike substrate by a CVD system (not shown) and the substrate is wound up backward into a roll.

Then, the transparent electrode layer 206 is formed by a reactive sputtering system (not shown) and the substrate is wound up further backward into a roll.

FIGS. 4A and 4B show the BR apparatus disclosed in Japanese Patent Application Laid-Open No. 06-116722, which is a continuous sputtering system for forming the metal layer 202 and the transparent conductive film (the metal oxide film 203a, 203b in the present invention) on the beltlike substrate 404 while moving it.

EXAMPLES

Example 1

In the present example, after execution of baking at the temperature of 600° C. for the baking time of fifty five minutes, the BR layer was formed.

In the present example, the point is two steps following: "the step of making oxygen adsorbed on the Al target" and "the step of generating the oxygen plasma on the ZnO target". The initial conditions for discharge at the cathode electrodes at that time are presented in Table 1. The electrodes No. 1, No. 2, Nos. 3 and 4, and Nos. 5 to 18 in Table 1 correspond to the electrodes used in the step 1, in the step 2, in the step 3-A, and in the step 3-B, respectively, of the present invention.

As presented in Table 2, the discharge current values of the $O_2$ or $O_2$—Ar mixed plasma at the cathode electrode 3 are specified as 4.2 A, 4.2 A, 1.8 A, 1.26 A, and 1.26 A at respective passing points of 0 h, 4.5 h, 9 h, 13.5 h, and 18 h, and the points are connected by a smooth curve. The discharge current values of the $O_2$ or $O_2$—Ar mixed plasma at the cathode electrode 4 are also specified by the same ratios at the same points as those at the cathode electrode 3. FIG. 1A schematically shows the discharge current values.

Table 3 presents the discharge currents and discharge voltages at the cathode electrodes 3, 4 at intervals of 2 h in this case. In Table 3, 0–4.5 h corresponds to 1st Q; 4.5–9 h to 2nd Q; 9–13.5 h to 3rd Q; and 13.5–18 h to 4th Q.

The back reflecting layer in the present example was formed for 18 h, the solar cell was formed thereon, and the solar cell was evaluated as to the conversion efficiency, Voc, and Jsc. The results of the evaluation are indicated by mark Δ in FIGS. 3A to 3C to show relative values of the conversion efficiency, Voc, and Jsc. In the figures, Jsc demonstrates a slight decrease in the zone of slab No. 100 to No. 2400.

The above-stated solar cell was formed according to the following sixth steps; that is, the sixth steps of cleaning, back reflecting layer formation, photovoltaic layer formation, transparent electrode layer formation, cutting into slabs, and cell formation. Each of the steps will be described below in order.

(1) Cleaning Step

A substrate 201 (material: stainless steel SUS430 2D, shape: roll shape, dimensions: width 360 mm×thickness 0.15 mm×length 1100 m) before cleaning was set in an unrepresented Roll to Roll type cleaning system, and was conveyed at the conveying speed of 10 m/min with a tension enough to eliminate a slack in the conveying direction to be passed through cleaning baths containing an alkali detergent and a surfactant and through a pure water rinse bath so as to be degreased and cleaned well, and to be dried.

(2) Back Reflecting Layer Forming Step

The cleaned substrate 201 was set in the Roll to Roll type sputtering apparatus of FIGS. 4A, 4B and was conveyed at the conveying speed of 1.3 m/min with a tension enough to eliminate a slack in the conveying direction. Then, sputtering was started under the initial discharge conditions presented in Table 1 to form the back reflecting layer 204.

First, a method of forming the metal layer 202, which corresponds to the step 1, will be described. An Al (aluminum) target as a metal ingredient is placed on an electrode 1, Ar (argon) gas is introduced into a chamber, and dc magnetron sputtering is effected so as to flow the constant current of 3.6 A through the electrode 1, thereby forming an Al film in the thickness of about 200 nm on the substrate 201.

The following will describe a method of forming the metal film 202, corresponding to the step 2 of bringing the surface of the metal layer into contact with active oxygen. Oxygen gas is guided onto an Al target placed on an electrode 2 to establish a state in which oxygen adsorbs without power on the electrode 2 or to form a very thin aluminum oxide film on the metal layer formed in the above step 1. At the stage herein, the introduced oxygen is indirectly excited by the Ar plasma or the oxygen plasma induced at the adjacent electrode 1 or electrode 3. Therefore, the density of active oxygen is much lower than the plasma density at the electrode 1 or at the electrode 3 where discharge occurs.

Further, the following will describe a method of forming the metal oxide film 203$a$ (oxygen plasma), corresponding to the step 3-A of forming the metal oxide film in a state of contact with active oxygen. Oxygen gas is introduced onto ZnO targets and dc magnetron sputtering is implemented so as to flow the constant currents of 4.2 A and 2.8 A through electrode 3 and through electrode 4, respectively. This part forms the interface between ZnO and Al and the thickness thereof is determined depending upon circumstances.

The following will describe a method of forming the metal oxide film 203$b$ (Ar plasma), corresponding to the step 3-B of forming the metal oxide film in a state of being not in contact with active oxygen. Ar gas is introduced onto ZnO targets and dc magnetron sputtering is implemented so as to flow the constant current of 12.5 A through each of electrodes 5 to 18.

(3) Photovoltaic Layer Forming Step

The following will describe a method of forming the photovoltaic layer 205, corresponding to the aforementioned a-Si type triple cells.

The substrate with the back reflecting layer thereon is set in an unrepresented photovoltaic layer forming apparatus and is conveyed at the conveying speed of 1.3 m/min with a tension enough to eliminate a slack in the conveying direction. Then, the photovoltaic layer is formed in the stack structure of a bottom cell comprised of n-type a-Si, i-type a-SiGe, and p-type $\mu$c-Si layers in order, a middle cell comprised of n-type a-Si, i-type a-SiGe, and p-type $\mu$c-Si layers in order, and a top cell comprised of n-type a-Si, i-type a-Si, and p-type $\mu$c-Si layers in order. Namely, when only the i-type layers are extracted for expression, the triple cells are formed in the a-Si/a-SiGe/a-SiGe structure.

(4) Transparent Electrode Layer Forming Step

The substrate with the photovoltaic layer thereon was set in a dc magnetron sputtering system of the Roll to Roll method not shown, and ITO was deposited in the thickness of 60 nm on the photovoltaic layer to form the transparent electrode layer 213.

(5) Slab Cutting Step

The substrate was passed through an unrepresented slab cutter and was cut into solar cell slabs in the size of 360 mm×250 mm (360 mm in the width of the substrate and 250 mm in the substrate conveying direction) while correcting curling of the substrate by a built-in curl corrector. Some of the slabs were sampled to measure curl amounts thereof. When the solar cell slabs were placed on a horizontal table, warp was observed in the substrate conveying direction. The height of warp is defined as a curl amount. A convex state on the light incidence side where the above thin film was formed is defined as a positive curl amount. Then, the curl corrector was adjusted so that the curl measurements fell in the range of 0 to +3.0 mm.

(6) Cell Forming Step

The solar cell slabs with the curl amounts in the range of 0 to +3.0 mm were run on an unrepresented solar cell slab line to be subjected to a module forming process including etching, electrolytic processing, and so on. Thereafter, an insulating tape was bonded, then forty two wires were laid as collecting electrodes 207 at intervals of the wire pitch of 5.6 mm, a positive electrode tab was coupled to the upper surfaces of the wires, and the insulating tape was coupled to the lower surfaces of the wires. A negative electrode tab was bonded to a surface on the opposite side of the insulating tape and this negative electrode tab was brought into electrical contact with the substrate 202.

The solar cells thus produced were evaluated by the method described in the previous section [Degradation of characteristics under constant discharge conditions of BR apparatus].

Namely, the conversion efficiency, Voc, and Jsc were determined by the solar simulator and the spectral sensitivity measuring system and analysis was conducted on Jsc of each of the bottom cell, the middle cell, and the top cell. FIGS. 3A to 3C present the characteristics of the present example as relative values of the conversion efficiency, Voc, and Jsc.

In FIGS. 3A to 3C, the horizontal axis represents the slab numbers, and the vertical axis the relative values of the conversion efficiency, Voc, and Jsc in order from the top. In FIGS. 3A to 3C, the reference (100%) is defined at the conversion efficiency: 10.55%, Voc: 2.08 V, and Jsc: 7.45 mA/cm$^2$.

In FIGS. 3A to 3C, clear improvement is recognized as compared with FIGS. 5A to 5C, while resolving the variation of conversion efficiency dependent upon slab numbers, i.e., upon portions of the beltlike substrate. Improvement is also seen in Jsc, as compared with FIGS. 5A to 5C, though there is the variation of about ±2%.

Example 2

The present example will describe a case of changing current values on a stepwise basis.

This was a simplified example of Example 1. In Example 2, the BR film was formed in the same manner as in Example 1 except that the setting of the discharge current values at the cathode electrodes 2, 3 corresponding to the amounts of active oxygen was replaced by that in Table 4, and the solar cell was produced and evaluated in much the same manner as in Example 1. In the present example, 18-hour film formation was implemented by three steps of setting values.

In this case, Jsc of the solar cells demonstrated characteristics equivalent to those in Example 1, except in the change regions of discharge current values. In the change regions of discharge current values, there was mixed characteristics equivalent to those in Example 1 and characteristics exhibiting decrease of conversion efficiency of about 5%.

Just as in Example 1, Table 5 presents the discharge currents and discharge voltages at the cathode electrodes 3, 4 at intervals of 2 h. In Table 5, within each setting of an identical discharge current, the discharge voltage increases with time. For example, at the cathode electrode 3 at 0 h, 2 h, and 4 h, the discharge current value is equal to 4.2 A, while the discharge voltage is gradually increased in order, 299 V, 301 V, and 302 V.

Example 3

The present example is an example in which the cathode electrode 3 and the cathode electrode 4 both are used in the initial stage and in which only the cathode electrode 4 is used from the middle.

When compared with Example 2, the discharge current value at the cathode electrode 3 was 4.2 A in 1st Q, which is equal to that in Example 2, and the discharge current was 0 in 2nd Q to 4th Q. The other discharge conditions herein were equal to those in Example 2, and the pressure of water vapor in the ambience of the BR apparatus was 1636 [Pa] (12.3 mmHg). In other words, the BR film was formed in much the same manner as in Example 1 except that the setting was changed to that as presented in Table 6 and that the pressure of water vapor was set as described, and the solar cells were produced and evaluated in much the same manner as in Example 1.

In FIGS. 3A to 3C mark ▲ indicates the results of evaluation as relative values of the conversion efficiency, Voc, and Jsc of the solar cells in the present example.

In the graph of relative values of conversion efficiency in FIG. 3A the marks Δ and ▲ lie one over another in the zone of slab No. 2600 to No. 3600, but the mark Δ is shifted a little below for easier recognition of the change of the mark Δ.

In FIG. 3B, the Voc relative values are perfectly coincident between the marks Δ and ▲, and the mark Δ is behind the mark ▲.

In the graph of relative values of Jsc in FIG. 3C the marks Δ and ▲ lie one over another in the zone of slab No. 2600 to No. 3600, but the mark Δ is shifted a little below for easier recognition of the change of the mark Δ.

As compared with the mark Δ indicating Example 1, the mark ▲ in the present example indicates improvement in the conversion efficiency and Jsc in the zone of slab No. 0 to No. 2400.

Example 4

The present example is an example in which the back reflecting layer was formed under the discharge conditions of Table 6 and the pressure of water vapor of 1955 Pa (14.7 mmHg) in the chamber ambience for 18 hours and in which the solar cells were formed thereon. Namely, the BR film was formed in much the same manner as in Example 3 except for the pressure of water vapor as described above, and the solar cells were produced and evaluated.

However, the BR film was formed after execution of baking at the temperature of 600° C. for the baking duration of 62 minutes.

In FIGS. 3A to 3C mark ● represents the results of evaluation as relative values of the conversion efficiency, Voc, and Jsc of the solar cells corresponding to the present example. As apparent from FIGS. 3A to 3C, the conversion efficiency, Voc, and Jsc all are approximately constant in the zone from slab No. 100 to No. 3400, though there are exceptions at two or three points of the conversion efficiency and at one point of Jsc.

Example 5

The present example is an example in which the back reflecting layer was formed under the discharge conditions of Table 6 and the pressure of water vapor of 891 Pa (6.7 mmHg) in the chamber ambience for 18 hours and in which the solar cells were formed thereon. Namely, the BR film was formed in much the same manner as in Example 4 except for the pressure of water vapor, and the solar cells were produced and evaluated.

However, the BR film was formed after execution of baking at the temperature of 550° C. for the baking duration of 38 minutes.

In FIGS. 3A to 3C mark ■ indicates the results of evaluation as relative values of the conversion efficiency, Voc, and Jsc of the solar cells corresponding to the present example. As apparent from FIGS. 3A to 3C, the relative values of the conversion efficiency, Voc, and Jsc all are almost constant in the zone from slab No. 100 to No. 3400.

Example 6

The present example is an example in which the BR layer was formed after execution of baking at the temperature of 560° C. for the baking duration of 55 minutes.

The initial conditions for discharge at the cathode electrodes at that time are presented in Table 7. In the present example, the set current of cathode No. 2 is different from that in Example 1. Namely, the point is two steps following: "the step of generating the oxygen plasma on the Al target" and "the step of generating the oxygen plasma on the ZnO target". This "step of generating the oxygen plasma on the ZnO target" can be regarded as "the step of bringing the surface of the metal layer into contact with active oxygen" in view of the metal layer.

The back reflecting layer was formed according to the setting method of the discharge current values similar to Table 2, and the aforementioned solar cells were formed thereon and evaluated.

As a result, the solar cells provided the results comparable to those in Example 3.

When the above examples are compared with each other, it seems from FIGS. 3A to 3C that Examples 4 or 5 provides maximum and stable conversion efficiencies, Example 3 follows them, and Example 1 is a little inferior among the four examples.

It is noted that these data was taken in the periods from the rainy season to summer and that the above order would be a little different in winter. Namely, it is difficult to make a simple discrimination among Examples 1, 3, 4, and 5, and their deviation is in the range of approximately 2%, which is no substantial degradation of the effect of the present invention.

As described above, the preferred examples of the present invention have permitted the BR film to be formed with constant characteristics throughout the long-term film formation, and products with little variation can be provided in the case where the semiconductor element such as the solar cell or the like is formed on the BR layer. For example, in the case of solar cells, Jsc is maintained constant whereby products can be provided with little variation in conversion efficiency.

TABLE 1

Initial Discharge Conditions of Cathodes

| Cathode No. Step No | Set Current I [A] | Voltage V [V] uncontrolled | Power I × V [W] uncontrolled | Set Pressure [Pa] | Set Flow Rate (Gas Species) |
|---|---|---|---|---|---|
| No. 1 step 1 (A1) | 3.0 | 420 | 1260 | 0.25 | 35 (Ar) |
| No. 2 step 2 (A1) | 0 | 0 | 0 | 0.22 | 10 (O$_2$) |
| No. 3 step 3-A (ZnO interface) | 4.2 | 300 | 1260 | 0.22 | 10 (O$_2$) |
| No. 4 step 3-A (ZnO interface) | 2.8 | 400 | 1120 | 0.22 | 10 (O$_2$) |
| No. 5 step 3-B (ZnO) | 12.5 | 584 | 7300 | 0.27 | 50 (Ar) |
| No. 6 step 3-B (ZnO) | 12.5 | 552 | 6900 | 0.27 | 50 (Ar) |
| Nos. 7–18 step 3-B (ZnO) | 12.5 | 590–620 | 7375–7750 | 0.29 | 50 each (Ar) |

(Note)
Unit of Flow Rate: cm$^3$/min (normal)

TABLE 2

Setting of Discharge Current of Cathodes 3, 4

| | Elapsed Time | Cathode 3 | Cathode 4 | Ratio |
|---|---|---|---|---|
| 1Q | 0–4.5 hours | 4.2 A | 2.80 A | ×1 |
| 2Q | 4.5–9 hours | Varying | Varying | ×0.43 to ×1 |
| 3Q | 9–13.5 hours | Varying | Varying | ×0.3 to ×0.43 |
| 4Q | 13.5–18 hours | 1.26 A | 0.84 A | ×0.3 |

TABLE 3

Setting of Discharge Current and Measurement of Discharge Voltage of Cathodes 3, 4

| Elapsed Time (hours) | Cathode 3 Current/voltage [A]/[V] | Cathode 4 Current/voltage [A]/[V] |
|---|---|---|
| 0 | 4.2/299 | 2.8/400 |
| 2 | 4.2/301 | 2.8/412 |
| 4 | 4.2/302 | 2.8/430 |
| 6 | 3.3/238 | 2.2/338 |
| 8 | 2.1/152 | 1.4/202 |
| 10 | 1.7/120 | 1.1/160 |
| 12 | 1.0/69 | 0.64/92 |
| 14 | 1.4/99 | 0.84/132 |
| 16 | 1.5/108 | 1.0/144 |
| 18 | 1.26/90 | 0.84/120 |

TABLE 4

Setting of Discharge Current of Cathodes 3, 4

| | Elapsed Time | Cathode 3 | Cathode 4 | Ratio |
|---|---|---|---|---|
| 1Q | 0–4.5 hours | 4.20 A | 2.80 A | ×1 |
| 2Q, 3Q | 4.5–13.5 hours | 1.81 A | 1.20 A | ×0.43 |
| 4Q | 13.5–18 hours | 1.26 A | 0.84 A | ×0.3 |

TABLE 5

Setting of Discharge Current and Measurement of Discharge Voltage of Cathodes 3, 4

| Elapsed Time (hours) | Cathode 3 Current/voltage [A]/[V] | Cathode 4 Current/voltage [A]/[V] |
|---|---|---|
| 0 | 4.2/299 | 2.8/400 |
| 2 | 4.2/301 | 2.8/412 |
| 4 | 4.2/302 | 2.8/430 |
| 6 | 1.81/284 | 1.2/396 |
| 8 | 1.81/285 | 1.2/410 |
| 10 | 1.81/287 | 1.2/422 |
| 12 | 1.81/288 | 1.2/437 |
| 14 | 1.26/274 | 0.84/426 |
| 16 | 1.26/274 | 0.84/440 |
| 18 | 1.26/275 | 0.84/450 |

TABLE 6

Setting of Discharge Current of Cathodes 3, 4

| | Elapsed time | Cathode 3 | Cathode 4 | Ratio |
|---|---|---|---|---|
| 1Q | 0–4.5 hours | 4.20 A | 2.80 A | ×1 |
| 2Q, 3Q | 4.5–13.5 hours | 0 A | 1.20 A | ×0, ×0.43 |
| 4Q | 13.5–18 hours | 0 A | 0.84 A | ×0, ×0.3 |

TABLE 7

Initial Discharge Conditions of Cathodes

| Cathode No. (Target Material) | Set Current I [A] | Measured Voltage V [V] uncontrolled | Power I × V [W] uncontrolled | Set Pressure [Pa] | Set Flow Rate (Gas Species) |
|---|---|---|---|---|---|
| No. 1 (A1) | 3.0 | 420 | 1260 | 0.25 | 35 (Ar) |
| No. 2 step 2 (A1) | 1.0 | 100 | 100 | 0.22 | 10 (O$_2$) |
| No. 3 step 3-A (ZnO interface) | 4.2 | 300 | 1260 | 0.22 | 10 (O$_2$) |
| No. 4 step 3-A (ZnO interface) | 2.8 | 400 | 1120 | 0.22 | 10 (O$_2$) |
| No. 4 step 3-B (ZnO) | 12.5 | 583 | 7300 | 0.27 | 50 (Ar) |
| No. 5 step 3-B (ZnO) | 12.5 | 552 | 6900 | 0.27 | 50 (Ar) |
| Nos. 7–17 step 3-B (ZnO) | 12.5 | 590 to 620 | 7375 to 7750 | 0.29 | 50 each (Ar) |

(Note)
Unit of Flow Rate: cm$^3$/min (normal)

What is claimed is:

1. A sputtering method of forming a stack of a metal film and a metal oxide film, comprising the step 1 of forming a metal layer on a substrate, the step 2 of bringing a surface of the metal layer on the substrate into contact with active oxygen, and the step 3 of forming a metal oxide film thereon after the step 2, wherein the step 3 includes the step A involving contact with active oxygen and the step B devoid of contact with active oxygen and wherein in the step A the contact with active oxygen occurs at a first substrate position and a second substrate position, wherein an amount of active oxygen at a the first substrate position is different from an amount of active oxygen at the second substrate position.

2. The sputtering method according to claim 1, wherein in the step A of the step 3 the amount of active oxygen is decreased on a continuous and/or stepwise basis.

3. The sputtering method of claim 1, wherein the substrate is a single substrate.

4. A sputtering method of forming a stack of a metal film and a metal oxide film, comprising the step 1 of forming a metal layer on a substrate, the step 2 of bringing a surface of the metal layer on the substrate into contact with active oxygen, and the step 3 of forming a metal oxide film thereon after the step 2, wherein in the step 2 the contact with active oxygen occurs at a first substrate position and a second substrate position and wherein an amount of active oxygen at the first substrate position is different from an amount of active oxygen that at the second substrate position.

5. The sputtering method according to claim 4, wherein in the step 2 the amount of active oxygen is decreased on a continuous or stepwise basis.

6. The sputtering method according to claim 4, wherein the substrate is a single substrate.

7. The sputtering method according to claim 1 or claim 4, wherein the substrate is a belt substrate.

8. A continuous sputtering method of forming a stack of a metal film and a metal oxide film on a continuous substrate, comprising: the step 1 of forming a metal layer on the continuous substrate, the step 2 of bringing a surface of the metal layer on the continuous substrate into contact with active oxygen, and the step 3 of forming a metal oxide film thereon after the step 2, wherein the step 3 includes the step A involving contact with active oxygen and the step B devoid of contact with active oxygen and wherein in the step A the contact with active oxygen occurs at a first portion of the continuous substrate and a second portion of the continuous substrate, wherein an amount of active oxygen at the first portion is different from an amount of active oxygen at the second portion.

9. The continuous sputtering method according to claim 8, wherein in the step A of the step 3 the amount of active oxygen is decreased on a continuous and/or stepwise basis.

10. A continuous sputtering method of forming a stack of a metal film and a metal oxide film on a continuous substrate, comprising the step 1 of forming a metal layer on the continuous substrate, the step 2 of bringing a surface of the metal layer on the continuous substrate into contact with active oxygen, and the step 3 of forming a metal oxide film thereon after the step 2, wherein in the step 2 the contact with active oxygen occurs at a first portion of the continuous substrate and a second portion of the continuous substrate and wherein an amount of active oxygen at the first portion is different from an amount of active oxygen at the second portion.

11. The continuous sputtering method according to claim 10, wherein in the step 2 the amount of active oxygen is decreased on a continuous or stepwise basis.

12. A batch sputtering method of forming a stack of a metal film and a metal oxide film on a plurality of substrates, comprising: the step 1 of forming a metal layer on a first batch substrate and a second batch substrate, the step 2 of bringing the surface of the metal layer on the first batch substrate and the second batch substrate in contact with active oxygen, and the step 3 of forming a metal oxide film thereon after step 2, wherein the step 3 includes the step A involving contact with active oxygen and the step B devoid of contact with active oxygen and wherein in the step A the contact with the active oxygen occurs at the first batch substrate and the second batch substrate wherein the amount of active oxygen at the first batch substrate is different from the amount of active oxygen at the second batch substrate.

13. The batch sputtering method according to claim 12, wherein in the step A of the step 3 the amount of active oxygen is decreased on a continuous and/or stepwise basis.

14. A batch sputtering method of forming a stack of metal film and metal oxide film on a plurality of substrates, comprising: the step 1 of forming a metal layer on a first batch substrate and a second batch substrate, the step 2 of bringing a surface of the metal layer on the first batch substrate and the second batch substrate into contact with active oxygen, and the step 3 of forming a metal oxide film thereon after the step 2, wherein in the step 2 the amount of active oxygen at the first batch substrate is different from an amount of active oxygen at the second batch substrate.

15. The batch sputtering method according to claim 14, wherein in the step 2 the amount of active oxygen is decreased on a continuous or stepwise basis.

16. A continuous sputtering method comprising: a step of forming a metal oxide film on a continuous substrate, wherein the step includes step A involving contact with active oxygen and step B devoid of contact with active oxygen and wherein in the step A the contact with active oxygen occurs at a first portion of the continuous substrate and a second portion of the continuous substrate, wherein an amount of active oxygen at the first portion is different from an amount of active oxygen at the second portion.

17. A batch sputtering method comprising: a step of forming a metal oxide film on a plurality of substrates, wherein the step includes step A involving contact with active oxygen and step B devoid of contact with active oxygen and wherein in the step A the contact with active oxygen occurs at a first batch substrate and a second batch substrate, wherein an amount of acitve oxygen at the first batch substrate is different from an amount of active oxygen at the second batch substrate.

* * * * *

UNITED STATES PATENT AND TRADEMARK OFFICE
CERTIFICATE OF CORRECTION

PATENT NO. : 6,860,974 B2
DATED : March 1, 2005
INVENTOR(S) : Hiroshi Echizen et al.

It is certified that error appears in the above-identified patent and that said Letters Patent is hereby corrected as shown below:

Column 16,
Line 41, "a" should be deleted; and
Line 57, "that" should be deleted.

Signed and Sealed this

Twelfth Day of July, 2005

JON W. DUDAS
*Director of the United States Patent and Trademark Office*